US010116292B2

United States Patent
Yokoi et al.

(10) Patent No.: US 10,116,292 B2
(45) Date of Patent: Oct. 30, 2018

(54) IGBT GATE DRIVING CIRCUIT

(71) Applicant: Renesas Electronics Corporation, Tokyo (JP)

(72) Inventors: Yoshihiko Yokoi, Tokyo (JP); Yusuke Ojima, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/468,326

(22) Filed: Mar. 24, 2017

(65) Prior Publication Data

US 2017/0288653 A1    Oct. 5, 2017

(30) Foreign Application Priority Data

Apr. 1, 2016 (JP) ................................. 2016-074187

(51) Int. Cl.
  *H03K 5/08*  (2006.01)
  *H03K 5/24*  (2006.01)
  *H03K 17/567*  (2006.01)

(52) U.S. Cl.
  CPC ................. *H03K 5/08* (2013.01); *H03K 5/24* (2013.01); *H03K 17/567* (2013.01)

(58) Field of Classification Search
  CPC ........... H03K 5/08; H03K 5/24; H03K 17/567
  USPC ...... 326/82, 83, 84, 85, 87, 89, 91; 327/108, 327/109, 110, 321
  See application file for complete search history.

(56) References Cited

U.S. PATENT DOCUMENTS

| 2009/0002054 A1* | 1/2009 | Tsunoda | ............. | H03K 17/0406 327/374 |
| 2015/0311692 A1* | 10/2015 | Hiyama | ............. | H03K 17/0828 361/31 |
| 2016/0301406 A1* | 10/2016 | Mori | ...................... | H01L 21/822 |

FOREIGN PATENT DOCUMENTS

JP          10-070878 A        3/1998

* cited by examiner

*Primary Examiner* — William Hernandez
(74) *Attorney, Agent, or Firm* — Sughrue Mion, PLLC

(57) ABSTRACT

There is a problem in related-art semiconductor devices that the chip size of a semiconductor device having an active Miller clamp function cannot be reduced. According to one embodiment, a semiconductor device is configured to, when a power device is turned on or off, monitor a gate voltage Vg of the power device, set a predetermined range within a transition range, the transition range being a range within which the gate voltage Vg changes, change, when the gate voltage Vg is within the predetermined range, the gate voltage Vg of the power device by using a predetermined number of constant-current circuits, and change, when the gate voltage Vg is outside the predetermined range, the gate voltage Vg by using a larger number of constant-current circuits than the number of constant-current circuits that are used when the gate voltage Vg is within the predetermined range.

6 Claims, 4 Drawing Sheets

IGBT GATE DRIVING CIRCUIT

CROSS-REFERENCE TO RELATED APPLICATIONS

This application is based upon and claims the benefit of priority from Japanese patent application No. 2016-074187, filed on Apr. 1, 2016, the disclosure of which is incorporated herein in its entirety by reference.

BACKGROUND

The present invention relates to a semiconductor device. For example, the present invention relates to a semiconductor device in which a control signal supplied to a gate of a power device is controlled based on slew-rate control.

A motor that drives a vehicle or the like requires large electric power in order to obtain a large output. Therefore, an inverter circuit that drives such a high-power motor is formed by using power devices such as IGBTs (Insulated Gate Bipolar Transistors) that can withstand a high voltage and a large current. Further, a gate of such a power device has a large parasitic capacitance. Therefore, to operate a power device, a gate driver capable of driving the gate of the power device is used. Japanese Unexamined Patent Application Publication No. H10-70878 discloses an example of such a gate driver.

In the technique disclosed in Japanese Unexamined Patent Application Publication No. H10-70878, a gate drive circuit is formed by using an isolation circuit, a command selecting circuit, a plurality of transistors, gate resistors for an on-state, gate resistors for an off-state, and a gate power supply. An externally-commanded selection signal and a command signal are input to the command selecting circuit through the isolation circuit, and one of the gate resistors for an on-state and one of the gate resistors for an off-state are selected. Further, transistors corresponding to the selected gate resistor for an on-state and the gate resistor for an off-state are alternately turned on/off based on the command signal.

SUMMARY

The present inventors have found the following problem. When a system using a power device is constructed, it is necessary to equip the system with a clamp circuit that maintains the gate of the power device at a high or low level in order to prevent the power device from malfunctioning due to a Miller capacitance. One example of the clamp circuit is an active Miller clamp circuit, which is formed by disposing a transistor having a small on-state resistance between the power device and a ground line. However, the active Miller clamp circuit requires a larger circuit size in order to reduce the resistance as much as possible and needs to be disposed separately from a gate drive circuit that provides the main function of the active Miller clamp circuit. Therefore, there is a problem that the chip size of a gate driver using an active Miller clamp circuit is large.

Other objects and novel features will be more apparent from the following description in the specification and the accompanying drawings.

According to one embodiment, a semiconductor device is configured to: when a power device is turned on or off, monitor a gate voltage of the power device; set a predetermined range within a transition range, the transition range being a range within which the gate voltage changes; change, when the gate voltage is within the predetermined range, the gate voltage of the power device by using a predetermined number of constant-current circuits; and change, when the gate voltage is outside the predetermined range, the gate voltage by using a larger number of constant-current circuits than the number of constant-current circuits that are used when the gate voltage is within the predetermined range.

According to the above-described embodiment, it is possible to realize a semiconductor chip having a malfunction prevention mechanism equivalent to the active Miller clamp circuit with a small chip size.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

For clarifying the explanation, the following descriptions and the drawings may be partially omitted and simplified as appropriate. Further, the same symbols are assigned to the same components throughout the drawings and duplicated explanations are omitted as required.

First Embodiment

A semiconductor device according to a first embodiment is a gate driver that drives a gate of a power device used in an inverter circuit that drives a load circuit requiring large electric power such as a high-power motor. Note that the power device may be any component having a low on-resistance and a high withstand voltage. Further, the circuit in which the power device is used is not limited to the inverter circuit.

Figure 1:
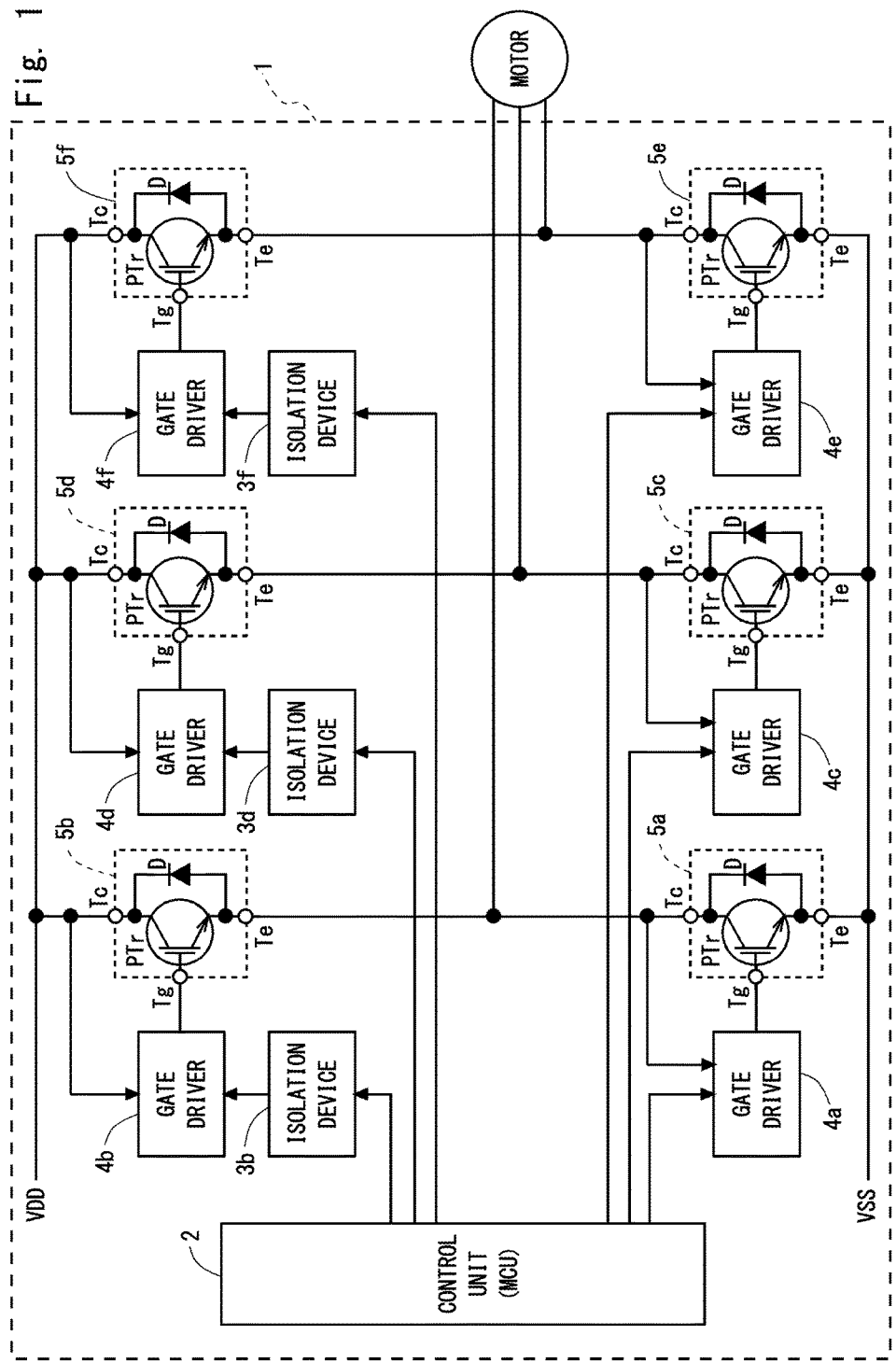
FIG. 1 is a block diagram of an inverter circuit including a semiconductor device according to a first embodiment.

FIG. 1 shows a block diagram of an inverter circuit including a semiconductor device according to the first embodiment. In the block diagram shown in FIG. 1, a motor is shown as a load circuit of the inverter circuit. The motor is a three-phase drive type motor. Therefore, the inverter circuit according to the first embodiment is a three-arm type circuit.

As shown in FIG. 1, the inverter circuit 1 according to the first embodiment includes a control unit 2, isolation devices 3b, 3d and 3f, gate drivers 4a to 4f, and power devices 5a to 5f. The control unit 2 outputs gate control signals (hereinafter referred to as "power device control signals") that are supplied to the gates of the power devices 5a to 5f. The power device control signals are PWM (Pulse Width Modulation) signals in the inverter circuit 1 according to the first embodiment. Further, the control unit 2 is, for example, a microcontroller (an MCU: Micro Controller Unit) in which an arithmetic circuit that executes a program, a memory that stores the program and the like, and peripheral circuits such as an analog-digital conversion circuit and a timer are disposed in one semiconductor package.

The isolation devices 3b, 3d and 3f transfer the power device control signals output from the control unit 2 to the gate drivers 4b, 4d and 4f, respectively, which operate in a voltage range different from that of the control unit 2. That is, the isolation devices 3b, 3d and 3f convert the reference level of the power device control signals.

The gate drivers 4a to 4f charge or discharge the gates of the power devices 5a to 5f, respectively, based on the logical level of the power device control signals. Further, the gate drivers 4a to 4f control the rate (or the speed) of the charging/discharging of the gates of the power devices 5a to 5f, respectively, based on the gate voltages of the power devices 5a to 5f, respectively. Details of the gate drivers 4a to 4f will be explained later.

Each of the power devices 5a to 5f includes a power transistor PTr and a diode D. The anode of the diode D is connected to the emitter of the power transistor PTr and the cathode of the diode D is connected to the collector of the power transistor PTr. Further, each of the power devices 5a to 5f includes a first terminal (e.g., an emitter terminal Te), a second terminal (e.g., a collector terminal Tc), and a control terminal (e.g., a gate terminal Tg). Note that the power transistor PTr is, for example, an IGBT (Insulated Gate Bipolar Transistor) component.

In the inverter circuit 1, the power devices 5a and 5b are connected in series between a power supply line VDD and a ground line VSS, and thereby form a first arm. The power devices 5c and 5d are connected in series between the power supply line VDD and the ground line VSS, and thereby form a second arm. The power devices 5e and 5f are connected in series between the power supply line VDD and the ground line VSS, and thereby form a third arm.

Figure 2:
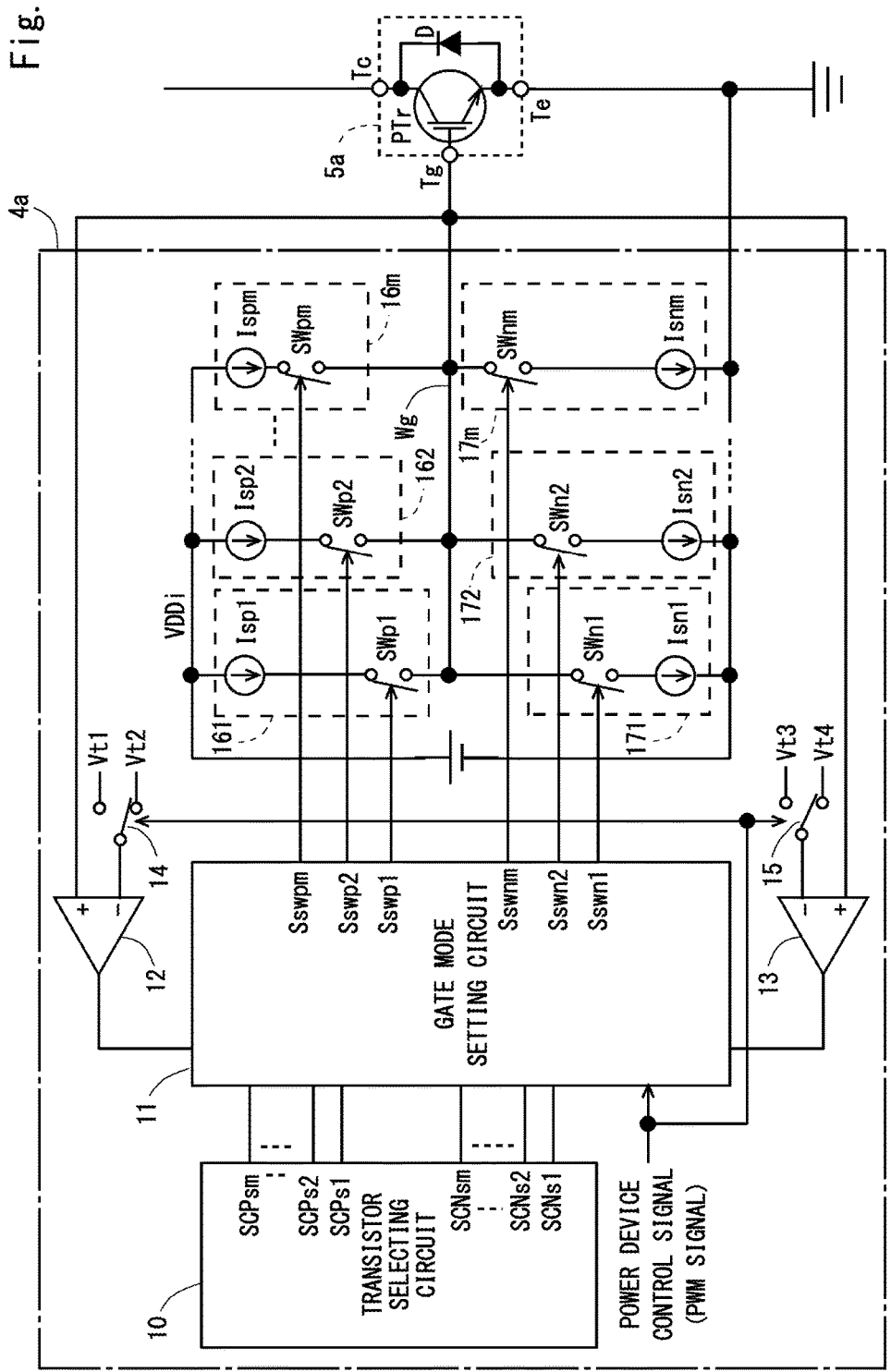
FIG. 2 is a block diagram of the semiconductor device according to the first embodiment.

Note that one of the features of the inverter circuit 1 according to the first embodiment lies in the gate drivers 4a to 4f. The gate drivers 4a to 4f have the same configuration. Therefore, the gate drivers according to the first embodiment are explained hereinafter by using only the gate driver 4a as an example. Accordingly, FIG. 2 shows a block diagram of the gate driver 4a according to the first embodiment. Note that FIG. 2 shows the power device 5a in order to explain a connection relation between circuits in the gate driver 4a and the power device 5a.

As shown in FIG. 2, the gate driver 4a according to the first embodiment includes a constant-current circuit selecting circuit (e.g., a transistor selecting circuit 10), a gate mode setting circuit 11, a first comparator 12, a second comparator 13, a first threshold voltage switching part (e.g., a first threshold voltage switch 14), a second threshold voltage switching part (e.g., a second threshold voltage switch 15), first constant-current circuits 161 to 16m (m is an integer), second constant-current circuits 171 to 17m, and a gate line Wg. Further, the gate driver 4a according to the first embodiment operates based on an internal power supply voltage that is supplied to an internal power supply line VDDi and is different from and lower than a power supply voltage for the inverter circuit 1. In the following explanation, the internal power supply line VDDi is simply referred to as a "power supply line VDDi".

The transistor selecting circuit 10 selects a constant-current circuit(s) to be activated from among the first constant-current circuits 161 to 16m and the second constant-current circuits 171 to 17m and outputs an activation instruction signal(s) to the selected constant-current circuit(s). The transistor selecting circuit 10 outputs activation signals SCPs1 to SCPsm and activation signals SCNs1 to SCNsm as activation signals. The activation signals SCPs1 to SCPsm and activation signals SCNs1 to SCNsm correspond to the first constant-current circuits 161 to 16m and the second constant-current circuits 171 to 17m, respectively.

The gate mode setting circuit 11 controls an on/off-state(s) of the constant-current circuit(s) selected by the transistor selecting circuit 10 based on a gate control signal (e.g., a power device control signal) for controlling an on/off-state of a power device, the activation signals SCPs1 to SCPsm, the activation signals SCNs1 to SCNsm, a first voltage detection signal, and a second voltage detection signal. The first voltage detection signal is an output signal of the first comparator 12. The second voltage detection signal is an output signal of the second comparator 13.

More specifically, the gate mode setting circuit 11 controls the on/off-state of the constant-current circuit(s) selected by the transistor selecting circuit 10 in a period in which the first and second voltage detection signals have different logical levels. Further, the gate mode setting circuit 11 increases the number of constant-current circuits that are controlled to an on-state in a period in which the first and second voltage detection signals have the same logical level compared to the number of constant-current circuits controlled in the period in which the first and second voltage detection signals have different logical levels.

The first comparator 12 changes the logical level of the first voltage detection signal from a first logical level (e.g., a low level) to a second logical level (e.g., a high level) when a voltage at the gate terminal Tg becomes higher than a first threshold voltage. The voltage at the gate terminal Tg (e.g., a gate voltage Vg) is input to a non-inverting input terminal of the first comparator 12. The first threshold voltage selected by the first threshold voltage switch 14 is input to an inverting input terminal of the first comparator 12.

In the gate driver 4a according to the first embodiment, a first pre-boost threshold voltage Vt1 and a first clamp threshold voltage Vt2 lower than the first pre-boost threshold voltage Vt1 are used as the first threshold voltages. The first threshold voltage switch 14 selects the first pre-boost threshold voltage Vt1 in a period in which the power device control signal has a high level, and selects the first clamp threshold voltage Vt2 in a period in which the power device control signal has a low level. Further, the first threshold voltage switch 14 supplies the selected threshold voltage to the first comparator 12.

The second comparator 13 changes the logical level of the second voltage detection signal from a low level to a high level when the voltage at the gate terminal Tg becomes higher than a second threshold voltage. The gate voltage Vg is input to a non-inverting input terminal of the second comparator 13. The second threshold voltage selected by the second threshold voltage switch 15 is input to an inverting input terminal of the second comparator 13.

In the gate driver 4a according to the first embodiment, a second clamp threshold voltage Vt3 and a second pre-boost threshold voltage Vt4 lower than the second clamp threshold voltage Vt3 are used as the second threshold voltages. The second threshold voltage switch 15 selects the second clamp threshold voltage Vt3 in a period in which the power device control signal has a high level, and selects the second pre-boost threshold voltage Vt4 in a period in which the power device control signal has a low level. Further, the second threshold voltage switch 15 supplies the selected threshold voltage to the second comparator 13.

Note that the first pre-boost threshold voltage Vt1, the first clamp threshold voltage Vt2, the second clamp threshold voltage Vt3, and the second pre-boost threshold voltage Vt4 have a voltage relation "Vt2<Vt1<Vt4<Vt3".

The first constant-current circuits 161 to 16m are connected between the gate line Wg and the power supply line VDDi. The first constant-current circuits 161 to 16m include first constant-current sources Isp1 to Ispm, respectively, and first switches SWp1 to SWpm, respectively. One ends of the first constant-current sources Isp1 to Ispm are connected to the power supply line. The first switches SWp1 to SWpm are connected between the other ends of the first constant-current sources Isp1 to Ispm and the gate line Wg, and their open/close states are switched by the gate mode setting circuit 11.

The second constant-current circuits 171 to 17m are connected between the gate line Wg and the ground line. The second constant-current circuits 171 to 17m include second constant-current sources Isn1 to Isnm, respectively, and second switches SWn1 to SWnm, respectively. One ends of the second constant-current sources Isn1 to Isnm are connected to the ground line. The second switches SWn1 to SWnm are connected between the other ends of the second constant-current sources Isn1 to Isnm and the gate line Wg, and their open/close states are switched by the gate mode setting circuit 11.

Note that the gate mode setting circuit 11 outputs switch control signals Sswp1 to Sswpm as signals for controlling the open/close states of the first switches SWp1 to SWpm, respectively. Further, the gate mode setting circuit 11 outputs switch control signals Sswn1 to Sswnm as signals for controlling the open/close states of the second switches SWn1 to SWnm, respectively. The switch control signals bring the first and second switches into an opened state (an on-state) when they have a high level, and bring the first and second switches into a closed state (an off-state) when they have a low level.

Figure 3:
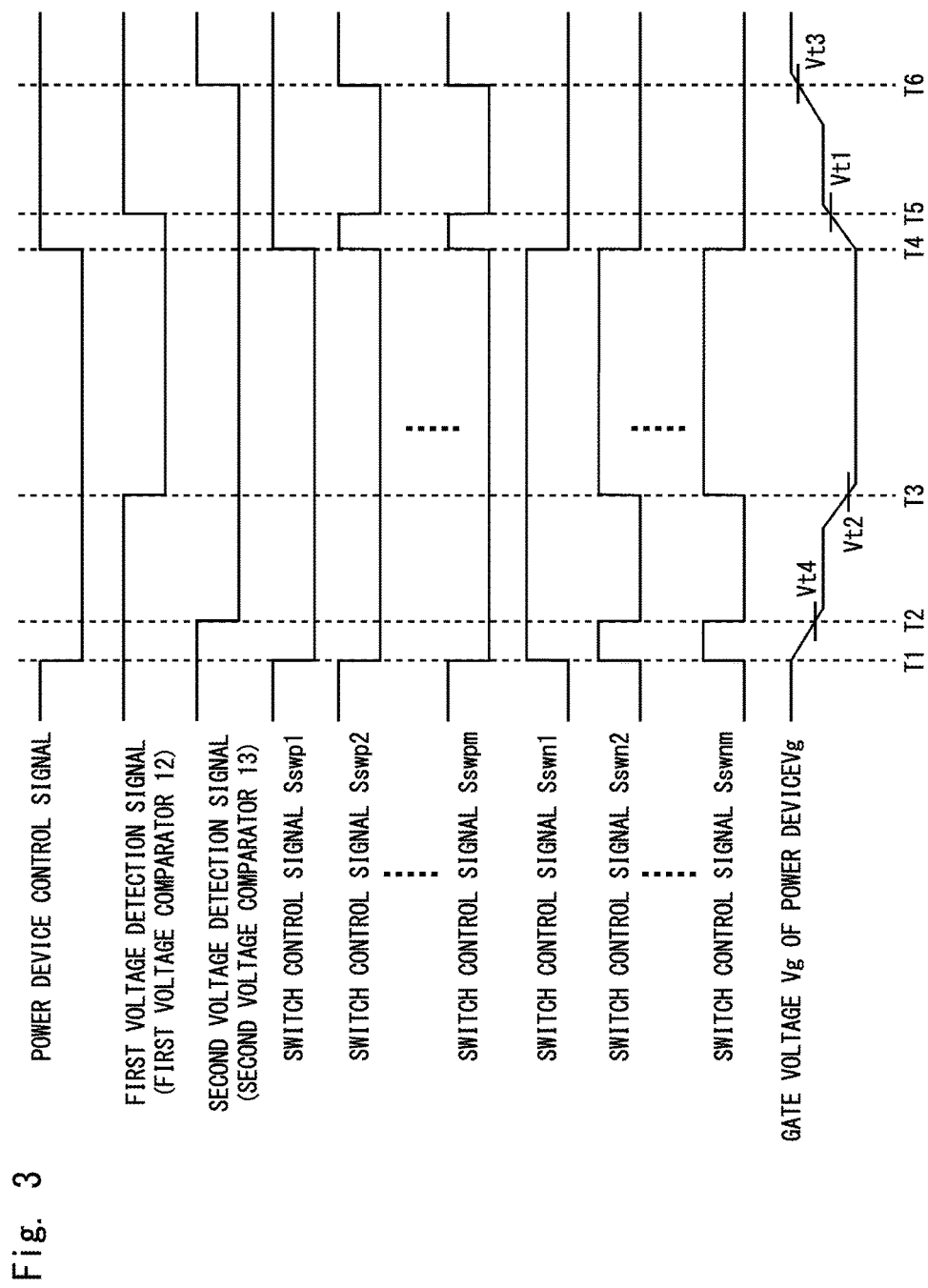
FIG. 3 is a timing chart for explaining an operation of the semiconductor device according to the first embodiment.

Next, an operation of the gate driver 4a according to the first embodiment is explained. Therefore, FIG. 3 shows a timing chart for explaining the operation of the gate driver 4a according to the first embodiment. Note that in the example shown in FIG. 3, the transistor selecting circuit 10 selects only the first constant-current circuit 161 and the second constant-current circuit 171 as circuits to be activated.

In the example shown in FIG. 3, the level of the power device control signal changes from a high level to a low level at a timing T1. As a result, the first threshold voltage switch 14 selects the first clamp threshold voltage Vt2 and the second threshold voltage switch 15 selects the second pre-boost threshold voltage Vt4.

Then, the gate mode setting circuit 11 changes the levels of the switch control signals Sswp1 to Sswpm from a high level to a low level. Further, the gate mode setting circuit 11 changes the level of the switch control signal Sswn1 from a low level to a high level.

Further, the timing T1 is a point of time (hereinafter also referred to as a "time point") at which an electric charge starts to be pulled out from the gate of the power device 5a and the gate voltage Vg of the power device 5a is higher than the second pre-boost threshold voltage vt4 and the first clamp threshold voltage Vt2. Therefore, the levels of both of the first and second voltage detection signals output from the first and second comparators 12 and 13, respectively, become a high level. As a result, the gate mode setting circuit 11 changes the levels of the switch control signals Sswn2 to Sswnm to a high level at the timing T1. That is, at the timing T1, all of the second constant-current circuits 171 to 17m become an active state and hence an electric charge is pulled out from the gate of the power device 5a by the second constant-current circuits 171 to 17m.

Next, at a timing T2, the gate voltage Vg of the power device 5a falls and becomes lower than the second pre-boost threshold voltage Vt4. As a result, the second comparator 13 changes the level of the second voltage detection signal from the high level to a low level. Then, in response to the fall of the second voltage detection signal to the low level, the gate mode setting circuit 11 changes the levels of the switch control signals Sswn2 to Sswnm to a low level. Therefore, from the timing T2 to a timing T3, the gate driver 4a performs slew-rate control in which an electric charge is pulled out from the gate of the power device 5a only by the second constant-current circuit 171, which the transistor selecting circuit 10 has instructed to activate.

Next, at the timing T3, the gate voltage Vg of the power device 5a further falls and becomes lower than the first clamp threshold voltage Vt2. As a result, the first comparator 12 changes the level of the first voltage detection signal from a high level to a low level. Then, in response to the fall of the first voltage detection signal to the low level, the gate mode setting circuit 11 changes the levels of the switch control signals Sswn2 to Sswnm to a high level again. Therefore, at and after the timing T3, the gate driver 4a performs clamp control in which the gate of the power device 5a is maintained at the low level by the second constant-current circuits 171 to 17m irrespective of whether the transistor selecting circuit 10 has instructed them to activate or not.

Next, in the example shown in FIG. 3, the level of the power device control signal changes from the low level to a high level at a timing T4. As a result, the first threshold voltage switch 14 selects the first pre-boost threshold voltage Vt1 and the second threshold voltage switch 15 selects the second clamp threshold voltage Vt3.

Then, the gate mode setting circuit 11 changes the levels of the switch control signals Sswn1 to Sswnm from the high level to a low level. Further, the gate mode setting circuit 11 changes the level of the switch control signal Sswp1 from the low level to a high level.

Further, the timing T4 is a time point at which an electric charge starts to be charged into (i.e., accumulated in) the gate of the power device 5a and the gate voltage Vg of the power device 5a is lower than the first pre-boost threshold voltage vt1 and the second clamp threshold voltage Vt3. Therefore, the levels of both of the first and second voltage detection signals output from the first and second comparators 12 and 13, respectively, become a low level. As a result, the gate mode setting circuit 11 changes the levels of the switch control signals Sswp2 to Sswpm to a high level at the timing T4. That is, at the timing T4, all of the first constant-current circuits 161 to 16m become an active state and hence an electric charge is charged into the gate of the power device 5a by the first constant-current circuits 161 to 16m.

Next, at a timing T5, the gate voltage Vg of the power device 5a rises and becomes higher than the first pre-boost threshold voltage Vt1. As a result, the first comparator 12 changes the level of the first voltage detection signal from the low level to a high level. Then, in response to the rise of the second voltage detection signal to the high level, the gate mode setting circuit 11 changes the levels of the switch control signals Sswp2 to Sswpm to a low level. Therefore, from the timing T5 to a timing T6, the gate driver 4a performs slew-rate control in which an electric charge is charged into the gate of the power device 5a only by the first constant-current circuit 161, which the transistor selecting circuit 10 has instructed to activate.

Next, at the timing T6, the gate voltage Vg of the power device 5a further rises and becomes higher than the second clamp threshold voltage Vt3. As a result, the second comparator 13 changes the level of the second voltage detection signal from the low level to a high level. Then, in response to the rise of the second voltage detection signal to the high level, the gate mode setting circuit 11 changes the levels of the switch control signals Sswp2 to Sswpm to a high level again. Therefore, at and after the timing T6, the gate driver 4a performs clamp control in which the gate of the power device 5a is maintained at the high level by the first constant-current circuits 161 to 16m irrespective of whether the transistor selecting circuit 10 has instructed them to activate or not.

As explained above, in the gate driver 4a according to the first embodiment, by monitoring the gate voltage Vg of the power device 5a by using the first and second comparators 12 and 13, a pre-boost operation can be performed at the start of the transition of the gate voltage Vg and, after the gate voltage Vg becomes equal to or higher than a specific voltage while reducing the transition time of the gate voltage Vg, slew-rate control can be performed.

Further, in the gate driver 4a according to the first embodiment, by monitoring the gate voltage Vg of the power device 5a, after the gate voltage Vg has sufficiently changed, clamp control for maintaining the gate voltage Vg of the power device 5a is performed by using a larger number of constant-current circuits than the number of constant-current circuits used in the slew-rate control period. That is, the gate driver 4a according to the first embodiment can realize functions equivalent to those of an active Miller clamp circuit without requiring transistors for the active Miller clamp circuit separately from those in the circuit used for the slew-rate control. Further, it is possible to reduce (or eliminate) the area for transistors used for the active Miller clamp circuit from the semiconductor chip and hence to reduce the size of the semiconductor chip.

Further, in the gate driver 4a according to the first embodiment, the threshold voltages supplied to the first and second comparators 12 and 13 are changed depending on whether the power device 5a is in an on-state or in an off-state by using the first and second threshold voltage switches 14 and 15. In this way, the gate driver 4a according to the first embodiment can reduce the number of comparators that are used to monitor the gate voltage Vg. Further, by reducing the number of comparators, the size of the semiconductor chip can be reduced.

Second Embodiment

Figure 4:
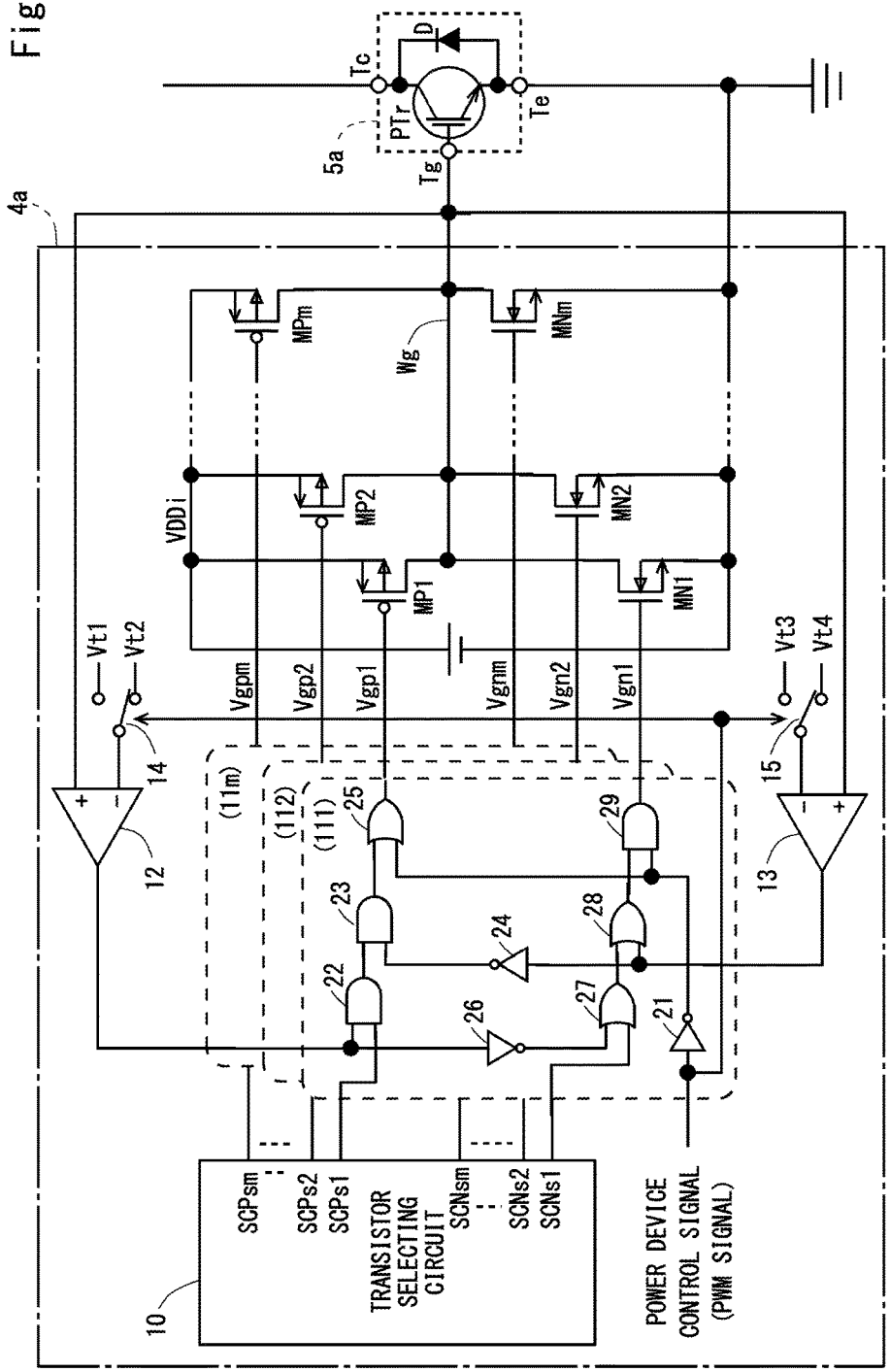
FIG. 4 is a block diagram of a semiconductor device according to a second embodiment.

In a second embodiment, specific examples of the gate mode setting circuit 11 and other embodiments of the first constant-current circuits 161 to 16m and the second constant-current circuits 171 to 17m are explained. Therefore, FIG. 4 shows a block diagram of a semiconductor device according to the second embodiment. Note that in the explanation of the second embodiment, the same symbols as those in the first embodiment are assigned to the same components as those in the first embodiment and their explanations are omitted.

As shown in FIG. 4, a gate driver 4a according to the second embodiment uses groups of logical circuits (hereinafter referred to as "logical circuit groups") 111 to 11m as the gate mode setting circuit 11. Further, PMOS transistors MP1 to MPm are used as the first constant-current circuits 161 to 16m and NMOS transistors MN1 to MNm are used as the second constant-current circuits 171 to 17m. The logical circuit groups 111 to 11m are provided so as to correspond to the PMOS transistors MP1 to MPm, respectively, and to the NMOS transistors MN1 to MNm, respectively. Further, the logical circuit groups 111 to 11m output gate voltages Vgp1 to Vgpm, respectively, and gate voltages Vgn1 to Vgnm, respectively, as signals for switching on/off-states of the PMOS transistors MP1 to MPm, respectively, and on/off-states of the NMOS transistors MN1 to MNm, respectively. Note that the logical levels of the gate voltages Vgp1 to Vgpm are opposite to those of the switch control signals Sswp1 to Sswpm explained in the first embodiment.

The logical circuit groups 111 to 11m have the same configuration. Therefore, they are explained hereinafter by using the logical circuit group 111 as an example. As shown in FIG. 4, the logical circuit group 111 includes NOT circuits 21, 24 and 26, a first logical multiplication circuit (e.g., an AND circuit 22), a second logical multiplication circuit (e.g., an AND circuit 23), a first logical sum circuit (e.g., an OR circuit 25), a second logical sum circuit (e.g., an OR circuit 27), a third logical sum circuit (e.g., an OR circuit 28), and a third logical multiplication circuit (e.g., an AND circuit 29).

The AND circuit 22 calculates the logical multiplication of a corresponding activation signal SCPs1 and a first voltage detection signal. The AND circuit 23 calculates the logical multiplication of an output value of the AND circuit 22 and a second voltage detection signal. The second voltage detection signal, which is input to the AND circuit 23, is a second voltage detection signal inverted by the NOT circuit 24. The OR circuit 25 calculates the logical sum of an output value of the AND circuit 23 and an inverted signal of a power device control signal and outputs the calculated value to a corresponding first constant-current circuit (e.g., a PMOS transistor MP1). The power device control signal, which is input to the OR circuit 25, is a power device control signal inverted by the NOT circuit 21.

The OR circuit 27 calculates the logical sum of a corresponding activation signal SCNs1 and an inverted signal of the first voltage detection signal. The first voltage detection signal, which is input to the OR circuit 27, is a first voltage detection signal inverted by the NOT circuit 26. The OR circuit 28 calculates the logical sum of an output value of the OR circuit 27 and the second voltage detection signal. The AND circuit 29 calculates the logical multiplication of an output value of the OR circuit 28 and an inverted signal of the power device control signal and outputs the calculated value to a corresponding second constant-current circuit (e.g., an NMOS transistor MN1). The power device control signal, which is input to the AND circuit 29, is the power device control signal inverted by the NOT circuit 21.

As explained above, the gate driver 4a according to the second embodiment can realize the logical circuit groups 111 to 11m, which are formed by simple logical circuits, as the gate mode setting circuit 11.

The present invention made by the inventors has been explained above in a specific manner based on embodiments. However, the present invention is not limited to the above-described embodiments, and needless to say, various modifications can be made without departing from the spirit and scope of the present invention.

For example, the gate driver 4a or the like explained in the above-described embodiments can be also applied to power devices other than the IGBTs.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first and second embodiments can be combined as desirable by one of ordinary skill in the art.

What is claimed is:

1. A semiconductor device comprising:
a gate line connected to a gate terminal of a power device including a first terminal, a second terminal, and the gate terminal;
a plurality of first constant-current circuits connected between the gate line and a power supply line;
a plurality of second constant-current circuits connected between the gate line and a ground line;
a constant-current circuit selecting circuit configured to select a constant-current circuit to be activated from among the plurality of first constant-current circuits and the plurality of second constant-current circuits and output an activation instruction signal to the selected constant-current circuit;
a first comparator configured to change a level of a first voltage detection signal from a first logical level to a second logical level when a voltage at the gate terminal becomes higher than a first threshold voltage;
a second comparator configured to change a level of a second voltage detection signal from the first logical level to the second logical level when the voltage at the gate terminal becomes higher than a second threshold voltage; and
a gate mode setting circuit configured to control an on/off-state of the constant-current circuit selected by the constant-current circuit selecting circuit based on a gate control signal for controlling an on/off-state of the power device, the activation instruction signal, the first voltage detection signal, and the second voltage detection signal,
wherein the gate mode setting circuit controls the on/off-state of the constant-current circuit selected by the constant-current circuit selecting circuit in a first period in which the first and second voltage detection signals have different logical levels,
the gate mode setting circuit controls the on/off-state of the constant-current circuit selected by the constant-current circuit selecting circuit in a second period in which the first and second voltage detection signals have the same logical level and
the gate mode setting circuit increases a number of constant-current circuits controlled in an on-state in the second period compared to a number of constant-current circuits controlled in an on-state in the first period.

2. The semiconductor device according to claim 1, wherein
the first threshold voltage includes a first pre-boost threshold voltage and a first clamp threshold voltage lower than the first pre-boost threshold voltage,
the second threshold voltage includes a second clamp threshold voltage and a second pre-boost threshold voltage lower than the second clamp threshold voltage,
the first pre-boost threshold voltage is lower than the second clamp threshold voltage,
the first clamp threshold voltage is lower than the second pre-boost threshold voltage, and the semiconductor device further comprises:
a first threshold voltage switching part configured to select the first pre-boost threshold voltage in a period in which the gate control signal has a high level, select the first clamp threshold voltage in a period in which the gate control signal has a low level, and supply the selected threshold voltage to the first comparator; and
a second threshold voltage switching part configured to select the second clamp threshold voltage in the period in which the gate control signal has the high level, select the second pre-boost threshold voltage in the period in which the gate control signal has the low level, and supply the selected threshold voltage to the second comparator.

3. The semiconductor device according to claim 1, wherein
each of the plurality of first constant-current circuits comprises:
a first constant-current source, one end of the first constant-current source being connected to the power supply line; and
a first switch connected between another end of the first constant-current source and the gate line, the first switch being configured so that its open/close state is switched by the gate mode setting circuit, and
each of the plurality of second constant-current circuits comprises:
a second constant-current source, one end of the second constant-current source being connected to the ground line; and
a second switch connected between another end of the second constant-current source and the gate line, the second switch being configured so that its open/close state is switched by the gate mode setting circuit.

4. The semiconductor device according to claim 1, wherein
each of the plurality of first constant-current circuits comprises a PMOS transistor configured so that its on/off-state is switched by the gate mode setting circuit, and
each of the plurality of second constant-current circuits comprises an NMOS transistor configured so that its on/off-state is switched by the gate mode setting circuit.

5. The semiconductor device according to claim 1, wherein
the gate mode setting circuit comprises a plurality of logical circuit groups provided so as to correspond to the plurality of first constant-current circuits, respectively, and to the plurality of second constant-current circuits, respectively,
each of the plurality of logical circuit groups comprises:
a first logical multiplication circuit configured to calculate a logical multiplication of a corresponding activation signal and the first voltage detection signal;
a second logical multiplication circuit configured to calculate a logical multiplication of an output value of the first logical multiplication circuit and an inverted signal of the second voltage detection signal;
a first logical sum circuit configured to calculate a logical sum of an output value of the second logical multiplication circuit and an inverted signal of the gate control signal and output the calculated value to a corresponding first constant-current circuit;
a second logical sum circuit configured to calculate a logical sum of the corresponding activation signal and an inverted signal of the first voltage detection signal;

a third logical sum circuit configured to calculate a logical sum of an output value of the second logical sum circuit and the second voltage detection signal; and a third logical multiplication circuit configured to calculate a logical multiplication of an output value of the third logical sum circuit and the inverted signal of the gate control signal and output the calculated value to a corresponding second constant-current circuit.

6. The semiconductor device according to claim 1, wherein the power device is an IGBT component, and a first, and second terminals are an emitter terminal, and a collector terminal, respectively.

* * * * *